(12) United States Patent
Gorbachov et al.

(10) Patent No.: US 10,944,008 B2
(45) Date of Patent: Mar. 9, 2021

(54) LOW NOISE AMPLIFIER TRANSISTORS WITH DECREASED NOISE FIGURE AND LEAKAGE IN SILICON-ON-INSULATOR TECHNOLOGY

(71) Applicant: SKYWORKS SOLUTIONS, INC., Irvine, CA (US)

(72) Inventors: Oleksandr Gorbachov, Irvine, CA (US); Lisette L. Zhang, Irvine, CA (US); Lothar Musiol, Irvine, CA (US)

(73) Assignee: SKYWORKS SOLUTIONS, INC., Irvine, CA (US)

(*) Notice: Subject to any disclaimer, the term of this patent is extended or adjusted under 35 U.S.C. 154(b) by 0 days.

(21) Appl. No.: 15/370,950

(22) Filed: Dec. 6, 2016

(65) Prior Publication Data

US 2017/0162705 A1    Jun. 8, 2017

Related U.S. Application Data

(60) Provisional application No. 62/264,485, filed on Dec. 8, 2015.

(51) Int. Cl.
*H01L 29/786* (2006.01)
*H01L 27/13* (2006.01)
(Continued)

(52) U.S. Cl.
CPC ........ *H01L 29/78609* (2013.01); *H01L 27/13* (2013.01); *H01L 29/0619* (2013.01);
(Continued)

(58) Field of Classification Search
None
See application file for complete search history.

(56) References Cited

U.S. PATENT DOCUMENTS

| 6,368,903 B1* | 4/2002 | Bryant .............. H01L 29/66757 257/E21.413 |
| 2002/0079544 A1* | 6/2002 | Shino .................. H01L 27/1203 257/388 |

(Continued)

OTHER PUBLICATIONS

PCT Search Report & Written Opinion for PCT/US2016/065552; dated Apr. 4, 2017.
(Continued)

*Primary Examiner* — Nilufa Rahim
(74) *Attorney, Agent, or Firm* — Lando & Anastasi, LLP

(57) ABSTRACT

A metal oxide semiconductor field effect transistor preferably fabricated with a silicon-on-insulator process has a first semiconductor region and a second semiconductor region in a spaced relationship thereto A body structure is defined by a channel segment between the first semiconductor region and the second semiconductor region, and a first extension segment structurally contiguous with the channel segment. A shallow trench isolation structure surrounds the first semiconductor region, the second semiconductor region, and the body structure, with a first extension interface being defined between the shallow trench isolation structure and the first extension segment of the body structure to reduce leakage current flowing from the second semiconductor region to the first semiconductor region through a parasitic path of the body structure.

13 Claims, 10 Drawing Sheets

(51) Int. Cl.
    *H01L 29/06*    (2006.01)
    *H01L 29/10*    (2006.01)
(52) U.S. Cl.
    CPC .... *H01L 29/1087* (2013.01); *H01L 29/78615*
        (2013.01); *H01L 29/78618* (2013.01); *H01L*
                                    *29/78696* (2013.01)

(56) References Cited

U.S. PATENT DOCUMENTS

| | | |
|---|---|---|
| 2004/0079995 A1 | 4/2004 | Bryant et al. |
| 2004/0232514 A1* | 11/2004 | Arai .................... H01L 21/2652 257/510 |
| 2007/0132035 A1 | 6/2007 | Ko et al. |
| 2008/0217727 A1* | 9/2008 | Kjar ...................... H01L 21/765 257/499 |
| 2009/0224335 A1* | 9/2009 | Chang ................ H01L 29/4238 257/396 |
| 2012/0286878 A1* | 11/2012 | Dening ................... H01L 23/66 330/296 |
| 2015/0228714 A1 | 8/2015 | Gorbachov et al. |

OTHER PUBLICATIONS

Kodeti, Narayana Murty; "White Paper on Silicon on Insulator (SOI) Implementation"; Infotech, Jun. 2009.
Malits, Maria; Corcos, Dan; Svetlitza, Alexander; Elad, Danny; Nemirovsky, Yael; "Thermal Performance of CMOS-SOI Transistors from Weak to Strong Inversion"; IEEE Instrumentation & Measurement Magazine, Oct. 2012.

* cited by examiner

LOW NOISE AMPLIFIER TRANSISTORS WITH DECREASED NOISE FIGURE AND LEAKAGE IN SILICON-ON-INSULATOR TECHNOLOGY

CROSS-REFERENCE TO RELATED APPLICATIONS

The application relates to and claims the benefit under 35 U.S.C. § 119(e) to U.S. Provisional Patent Application No. 62/264,485 filed Dec. 8, 2015 and entitled "LNA TRANSISTORS WITH DECREASED NOISE FIGURE AND LEAKAGE IN SOI TECHNOLOGY," the entire contents of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to semiconductor fabrication of integrated circuits, including those utilized in radio frequency (RF) applications. More particularly, the present disclosure relates to low noise amplifier transistors with decreased noise figure and leakage in silicon-on-insulator (SOI) technology.

2. Related Art

Complex, multi-function electronic devices are comprised of many interconnected modules and components, each of which serves a dedicated purpose. For instance, wireless communication devices may be comprised of a transmit chain and a receive chain, with the antenna and the transceiver being a part of both the transmit chain and receive chain. The transmit chain may additionally include a power amplifier for increasing the output power of the generated RF signal from the transceiver, while the receive chain may include a low noise amplifier for boosting the weak received RF signal so that information can be accurately and reliably extracted therefrom. The transmit chain and the receive chain may be selectively interconnected to the antenna with an RF switch, with the transmit chain components, receive chain components, and the RF switch being collectively referred to as a front end module. The front end module circuitry may be implemented as an integrated circuit that is fabricated on a semiconductor die.

Silicon-on-insulator (SOI) semiconductor technologies are widely used for fabricating integrated circuit devices, particularly those for RF applications such as front end modules, including the power amplifiers and low noise amplifiers thereof. SOI refers to the use of a layered silicon-insulator-silicon substrate in place of a more conventional bulk silicon substrate. On top of such semiconductor substrate, there is a thin dielectric layer of silicon dioxide, referred to as the buried oxide (BOX) layer. This layer may be created by flowing oxygen onto a plain silicon wafer and then heating the wafer to oxidize the silicon, thereby creating a uniform buried layer of silicon dioxide. An active region of silicon is formed on the BOX layer of the SOI substrate. This active silicon layer includes the active circuit elements such as transistors and diodes of the integrated circuit.

These active elements are physically separated and electrically isolated from each other by shallow trench isolation (STI) structures, which are formed by etching a trench between the active elements and filling the trench with a low-loss dielectric material. The STI structures separate and isolate the various active components along a horizontal plane. The BOX region electrically isolates the active elements from the semiconductor substrate and effectively reduce coupling between the active elements as well as the underlying silicon substrate.

The field effect transistor, and in particular the metal oxide semiconductor field effect transistor (MOSFET), is widely employed in RF integrated circuits for amplification and signal switching applications. The field effect transistor has a gate, along with a drain and a source that each correspond to a semiconductor channel of either n-type doping or p-type doping on a substrate, and a body. Those transistors with n-type channel doping may be referred to as NMOS transistors, while those transistors with p-type channel doping may be referred to as PMOS transistors In RF applications in which devices such as power amplifiers, low noise amplifiers, and RF switches are being fabricated, high-resistivity silicon substrates are utilized. This increases quality-factor (Q-factor) of the passive components implemented therewith including inductors, capacitors, and transmission lines. Additionally, overall losses are decreased. The decreased coupling between different parts of the circuit also results in increased efficiency and linearity in the performance of the integrated circuit overall.

Due to certain inherent properties of the SOI process technology, however, positive fixed charges may exist at the STI-semiconductor interface. This is understood to result in a parasitic NMOS transistor that is parallel with the main transistor structure. Control of the fixed interface charge density is challenging, as it may vary significantly from lot to lot of the semiconductor wafer, even within the same wafer foundry. The interface charge can lead to increased leakage current at low operating temperatures due to the decreased threshold voltage of the aforementioned parasitic NMOS transistor. Furthermore, mobile negative-induced charges in the vicinity of the main NMOS transistor channel is understood to add noise to the main transistor under certain conditions, which can adversely impact the noise figure (NF) of any low noise amplifier implemented with SOI technology. The aforementioned leakage current can also be problematic at nominal operating temperatures.

Accordingly, there is a need in the art for minimizing fixed interface charges in NMOS transistors implemented with SOI technology. There is also a need in the art for reducing resultant leakage current that degrades the performance of NMOS transistors, particularly in implementations of low noise amplifiers.

BRIEF SUMMARY

The present disclosure is directed to various embodiments of a field effect transistor. According to one embodiment, the field effect transistor is manufactured according to the silicon-on-insulator (SOI) process, and is a metal oxide semiconductor type. The field effect transistor may include a first semiconductor region, as well as a second semiconductor region that may be in a spaced relationship to the first semiconductor region. Additionally, the field effect transistor may include a body structure that is defined by a channel segment between the first semiconductor region and the second semiconductor region. The body structure may also include a first extension segment that is structurally contiguous with the channel segment. The field effect transistor may also include a shallow trench isolation structure surrounding the first semiconductor region, the second semiconductor region, and the body structure. A first extension interface may be defined between the shallow trench isolation structure and the first extension segment of the body structure, which is contemplated to reduce leakage current flowing from the second semiconductor region to the first semiconductor region through a parasitic path of the body structure.

The present disclosure also contemplates a semiconductor die including at least one field effect transistor fabricated in accordance with the various embodiments, as well as a radio frequency communications module with a low noise amplifier implemented with one or more embodiments of the field effect transistor. The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of a silicon-on-insulator (SOI) metal oxide semiconductor field effect transistor (MOSFET), and are not intended to represent the only form in which the disclosed transistors may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
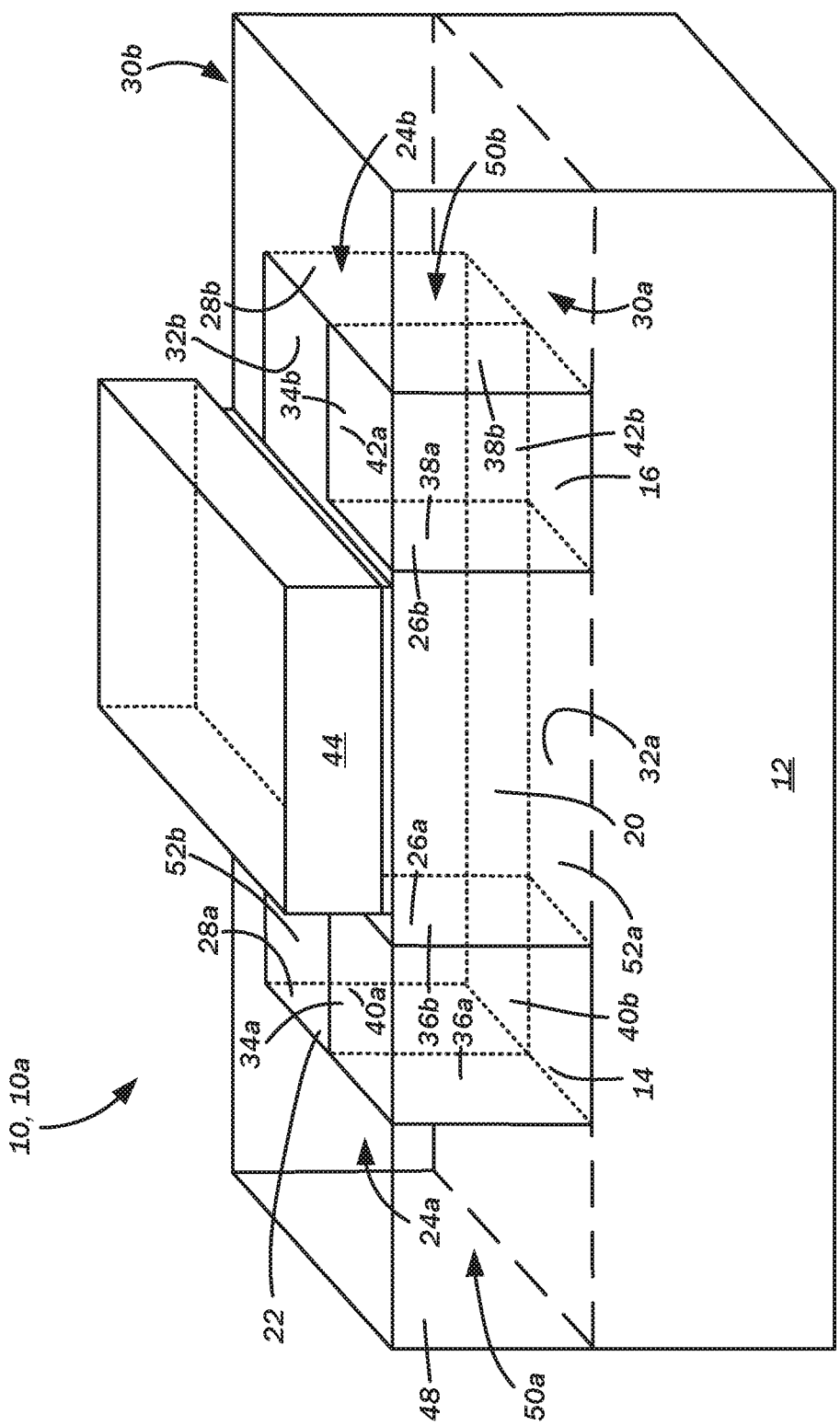
FIG. 1 is a perspective view of a silicon-on-insulator (SOI) field effect transistor with decreased noise figure and leakage according to a first embodiment.
Figure 2:
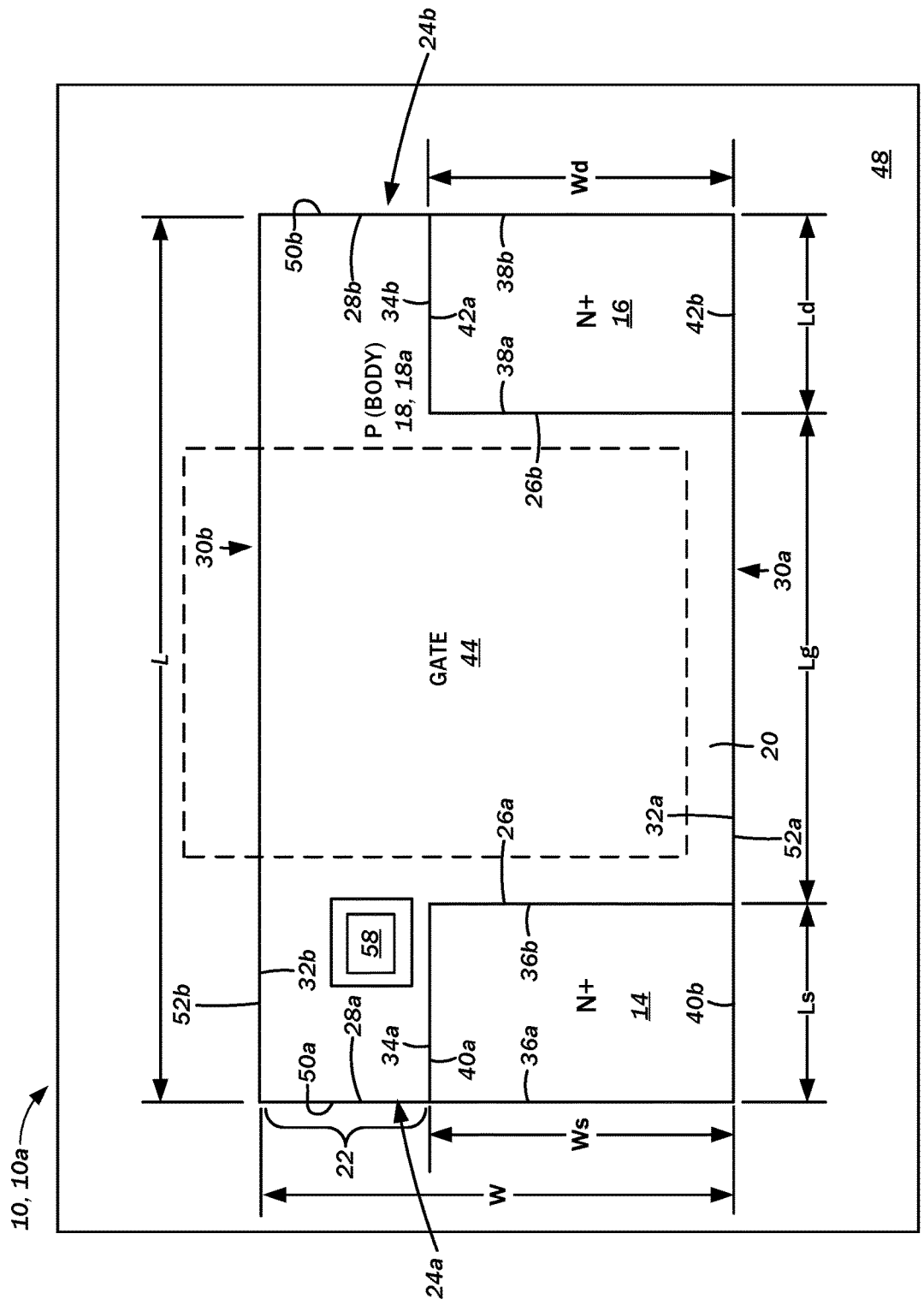
FIG. 2A is a top plan view of the first embodiment of the SOI field effect transistor shown in FIG. 1 including various structural details thereof
FIG. 2B is a top plan view of the first embodiment of the SOI field effect transistor depicting the positive fixed charge in a shallow trench isolation structure, a negative mobile charge in a body structure, and leakage current resulting therefrom.

With reference to FIGS. 1 and 2A, a field effect transistor 10, and specifically a first exemplary embodiment 10a thereof, is contemplated to be a complementary metal oxide semiconductor (CMOS) type fabricated with a silicon-on-insulator (SOI) process. However, the embodiments disclosed herein may be utilized in other silicon-based semiconductor fabrication technologies. As will be appreciated by those having ordinary skill in the art, SOI involves building MOSFETs on thin layers of crystalline silicon. Being a field effect transistor, there is understood to be a gate, a source, and a drain, and is implemented on a semiconductor substrate (not shown), on which a buried oxide (BOX) layer 12 is disposed. The BOX layer 12 is understood to isolate elements the various active elements from the semiconductor substrate, and is composed of silicon dioxide ($SiO_2$). However, any other suitable dielectric material may be readily substituted.

The field effect transistor 10 further includes a first semiconductor region 14, as well as a second semiconductor region 16 that is in a spaced relationship to the first semiconductor region. The first semiconductor region 14 and the second semiconductor region 16 are understood to be doped with an n-type dopant. In this regard, the field effect transistor 10 may be referred to as an n-type metal oxide semiconductor field effect transistor (NMOS). The first semiconductor region 14 may correspond to the aforementioned source of the field effect transistor 10, while the second semiconductor region 16 may correspond to the drain.

The field effect transistor 10 also includes a body structure 18 that is generally defined by a channel segment 20 and a first extension segment 22 that is structurally contiguous with the channel segment 20. The first embodiment of the field effect transistor 10a has a first variant of a body structure 18a, the details of which will be described more fully below. The channel segment 20 is disposed between the first semiconductor region 14 and the second semiconductor region 16, and is doped with a p-type dopant.

As particularly illustrated in FIG. 2A, the body structure 18a together with the first semiconductor region 14 and the second semiconductor region 16 has a generally rectangular configuration defined by a length l and a width w, and further by a first lateral end 24a and an opposed second lateral end 24b.

With additional reference to the perspective view of FIG. 1, the first lateral end 24a of the channel segment 20 is a channel segment left sidewall 26a, while the second lateral end 24b of the channel segment 20 is a channel segment right sidewall 26b. Furthermore, the first lateral end 24a of the first extension segment 22 is a first extension segment left sidewall 28a, and the second lateral end 24b of the first extension segment 22 is a first extension segment right sidewall 28b.

In addition to the lateral ends 24, the body structure 18a is defined by a front end 30a and an opposed rear end 30b. The front end 30a is part of the channel segment 20, and thus defines a front channel segment wall 32a that extends from the channel segment left sidewall 26a to the channel segment right sidewall 26b. The rear end 30b, on the other hand, is part of the first extension segment 22, and accordingly defines a rear first extension segment wall 32b that extends from the first extension segment left sidewall 28a to the first extension segment right sidewall 28b. The first extension segment 22 also has a front facing portion/defined by the front end 30a, which corresponds to a left first extension segment front wall 34a and a right first extension segment front wall 34b. The left first extension segment front wall 34a extends between the channel segment left sidewall 26a and the first extension segment left sidewall 28a, and the right first extension segment front wall 34b extends between the channel segment right sidewall 26b and the first extension segment right sidewall 28b. As can be seen, the first extension segment 22 extends laterally beyond the length of the channel segment 20 equally to the left and to the right.

The first semiconductor region 14 and the second semiconductor region 16 likewise have a generally rectangular configuration defined by lengths Ls and Ld, respectively, and widths Ws and Wd, respectively. It is to be understood that the terms length and width are referenced for purposes of convenience, and consistency with the frame of reference of the other components described herein. Opposed lengthwise parts of the first semiconductor region 14 correspond to an outer left sidewall 36a and an inner right sidewall 36b. Along these lines, opposed lengthwise parts of the second semiconductor region 16 correspond to an inner left sidewall 38a and an outer right sidewall 38b. Opposed widthwise parts of the first semiconductor region 14 correspond to an inner rear wall 40a and an outer front wall 40b, and opposed widthwise parts of the second semiconductor region 16 similarly correspond to an inner rear wall 42a and an outer front wall 42b.

The aforementioned features of the first semiconductor region 14, the second semiconductor region 16, and the body structure 18 are arranged and oriented in the first embodiment of the field effect transistor 10a as illustrated in FIGS. 1 and 2A. Specifically, the first extension segment left sidewall 28a is coplanar with the outer left sidewall 36a of the first semiconductor region 14. Further, the left first extension segment front wall 34a is parallel to and abuts against the inner rear wall 40a of the first semiconductor region 14. The channel segment left sidewall 26a of the body structure 18 is parallel to and abuts against the inner right sidewall 36b of the first semiconductor region 14. The outer front wall 40b of the first semiconductor region 14 is coplanar with the front channel segment wall 32a, as well as with the outer front wall 42b of the second semiconductor region 16. Further, the first extension segment right sidewall 28b is coplanar with the outer right sidewall 38b of the second semiconductor region 16. Along the same lines as the structure of the first semiconductor region 14, the inner rear wall 42a of the second semiconductor region 16 is parallel to and abuts against the right first extension segment front wall 34b, and the inner left sidewall 38a of the second semiconductor region 16 is parallel to and abuts against the channel segment right sidewall 26b.

As shown in FIG. 1, the first semiconductor region 14, the second semiconductor region 16, and the body structure 18 are understood to have a substantially uniform thickness, that is, the various walls thereof as described above have the same height. Moreover, these walls are depicted as true planar structures. It will be appreciated that these are ideal representations only, and when actually fabricated, there may be some deviations from the ideal structure. Notwithstanding the structural imperfections, however, the field effect transistors 10 are understood to function properly. These caveats are understood to be applicable to the remaining embodiments of the field effect transistors 10 disclosed herein.

The first semiconductor region 14, the second semiconductor region 16, and the body structure 18 are surrounded by a shallow trench isolation structure 48. That is, the shallow trench isolation structure 48 is defined by opposed left and right inner sidewalls 50a and 50b, as well as opposed front and rear inner walls 52a and 52b. The shallow trench isolation structure 48 may be fabricated from an oxide material such as silicon dioxide ($SiO_2$), and may have the same or different thickness as the first semiconductor region 14, the second semiconductor region 16, and the body structure 18 that it surrounds.

The left inner sidewall 50a of the shallow trench isolation structure 48 is parallel to and abuts against the first extension segment left sidewall 28a and the outer left sidewall 36a of the first semiconductor region 14. Likewise, the right inner sidewall 50b of the shallow trench isolation structure 48 is parallel to and abuts against the first extension segment right sidewall 28b and the outer right sidewall 38b of the second semiconductor region 16.

The front inner wall 52a is parallel to and abuts against the outer front wall 40b of the first semiconductor region 14, the front channel segment wall 32a of the body structure 18, and the outer front wall 42b of the second semiconductor region 16. Additionally, the rear first extension segment wall 32b is parallel to and abuts against the rear inner wall 52b of the shallow trench isolation structure 48.

Disposed above the body structure 18 in a substantially overlapping relation thereto is a gate terminal 44. Interposed between the gate terminal 44 and the body structure 18 is a gate oxide layer 46. When the gate terminal 44 is energized, an electrical conduction path (channel) is defined between the first semiconductor region 14 and the second semiconductor region 16.

Figure 2B:
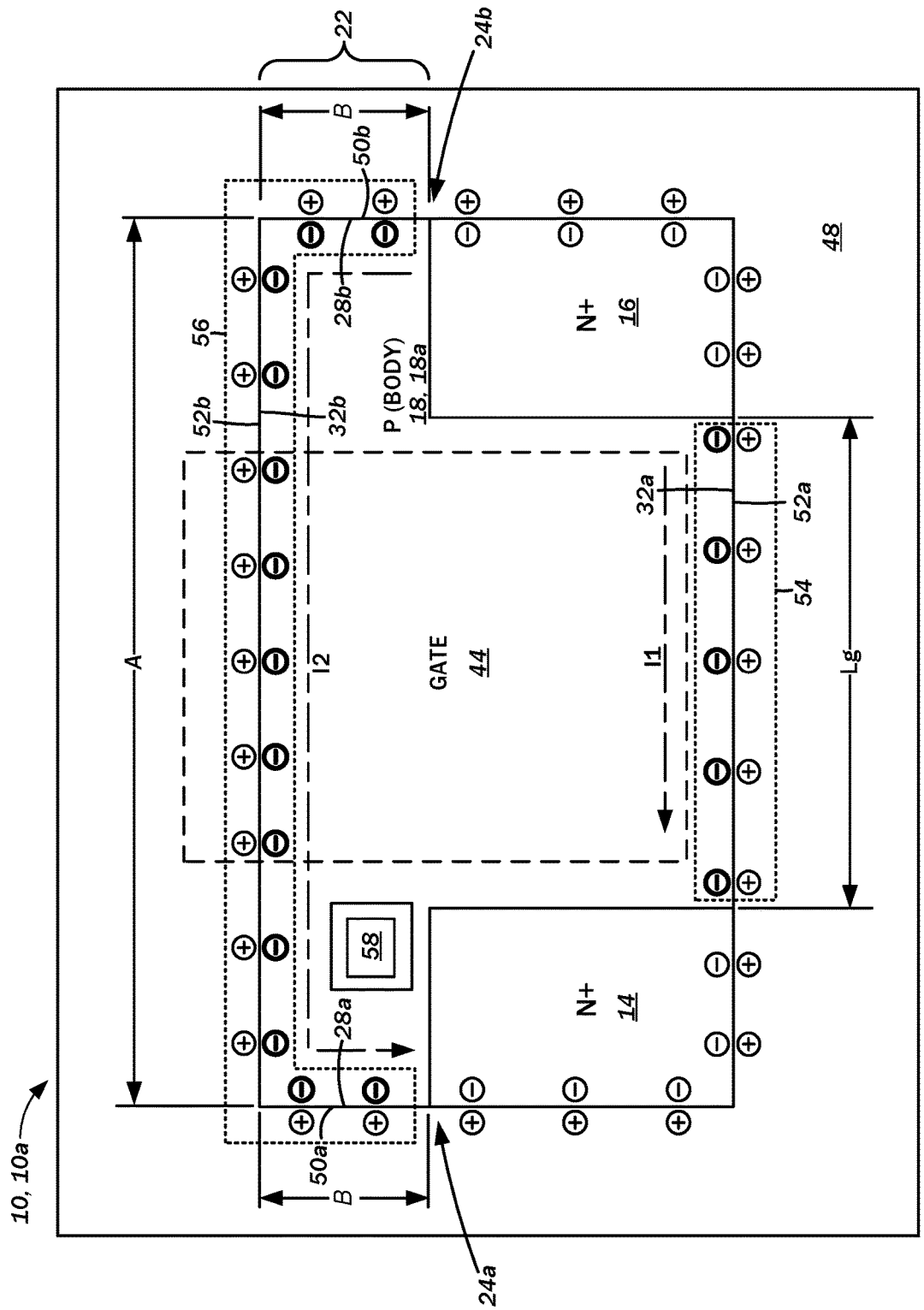

With reference to FIG. 2B, the shallow trench isolation structure 48 is understood to have a fixed positive charge as shown, and there is additionally a mobile induced negative charge in the body structure 18 and the first and second semiconductor regions 14, 16 as shown. The p-type material of the body structure 18 and the positive charge from the shallow trench isolation structure 48 define an interface that results in a parasitic transistor that can cause the field effect transistor 10 to deviate from its expected/modeled performance, particularly as it relates to current-voltage characteristics at different temperatures. Specifically, there is a channel interface 54 defined between the front inner wall 52a of the shallow trench isolation structure 48 and the front channel segment wall 32a of the body structure 18. The first and second semiconductor regions 14, 16 are understood to be in direct contact with the mobile negative charges at the channel interface 54, so even where the gate-source voltage is zero, there may be a leakage current (I1) when the drain-source voltage is greater than zero.

The various embodiments of the present disclosure, including the first embodiment of the field effect transistor 10a, contemplate extending the length of the interface of the shallow trench isolation structure 48 and the body structure 18, thereby lengthening the path between the first semiconductor region 14 and the second semiconductor region 16. It is understood that a shorter channel path may raise leakage current for a given set of operating conditions.

As described above, the first extension segment 22 increases this length, and additionally moves the interface between the shallow trench isolation structure 48 and the body structure 18 to be away from the channel. There is a first extension interface 56 defined between the rear inner wall 52b of the shallow trench isolation structure 48 and rear first extension segment wall 32b. The first extension interface 56 is also defined between the left inner sidewall 50a of the shallow trench isolation structure 48 and the first extension segment left sidewall 28a, and between the right inner sidewall 50b of the shallow trench isolation structure 48 and the first extension segment right sidewall 28b. Rather than the shorter distance Lg across the channel segment 20, the first extension interface 56 increases the length of the path of the leakage current I2 from the second semiconductor region 16 to the first semiconductor region 14 to the length B of the first extension segment right sidewall 28b, plus the length A of the rear first extension segment wall 32b, and plus another length B of the first extension segment left sidewall 28a, thereby decreasing the leakage current. The total leakage current is understood to be sum of the leakage current I1 and the leakage current I2. The first lateral end 24a of the first extension segment 22 further includes a body contact 58 that is connected to the body structure 18, and to either ground or a highly stable voltage source. In addition to the decreased leakage current, the noise contribution of the parasitic transistor to the field effect transistor 10 is also reduced.

Figure 3A:
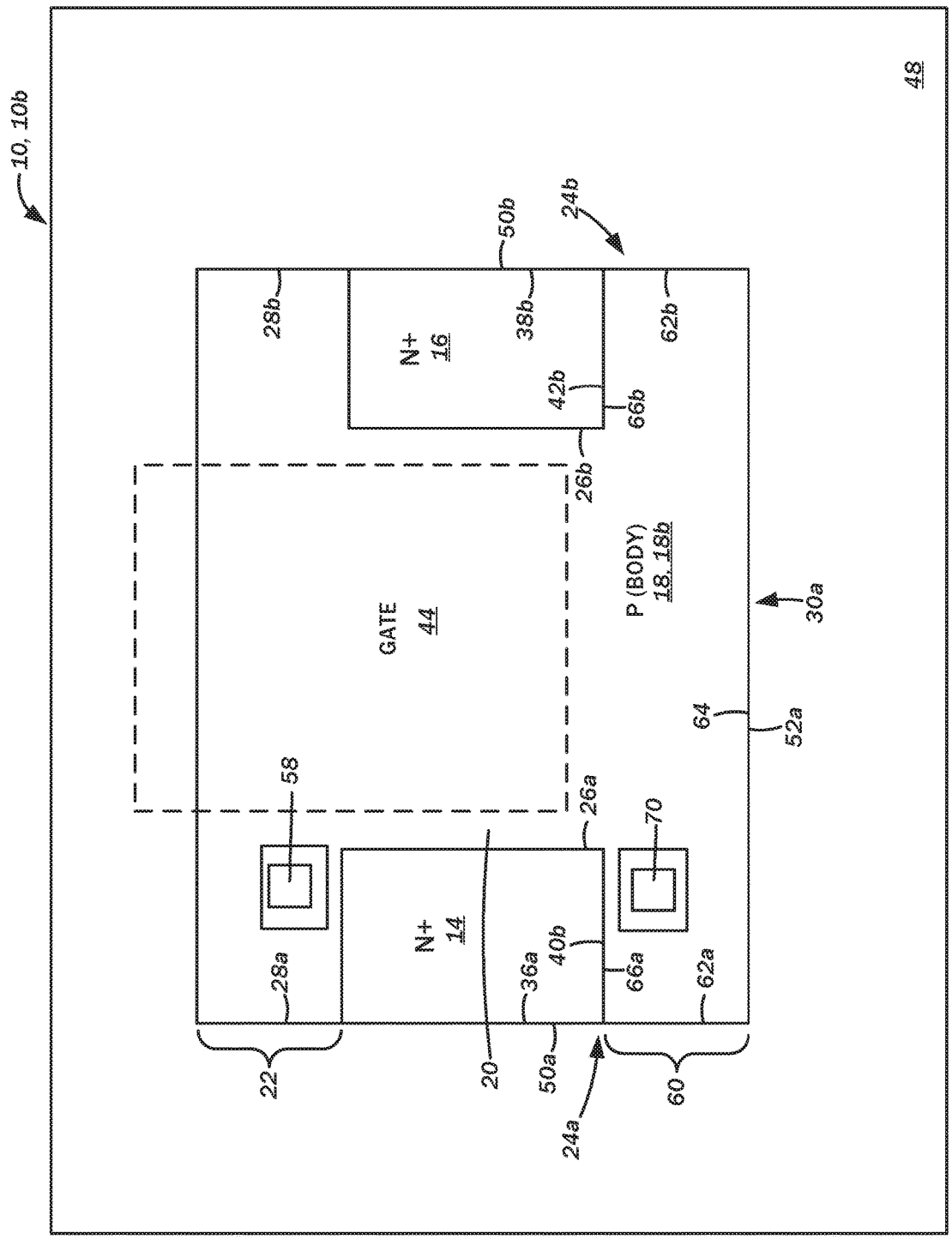
FIG. 3A is a top plan view of a second embodiment of the SOI field effect transistor.

Referring now to FIG. 3A, a second embodiment of the field effect transistor 10b has a second variant of the body structure 18b. The second embodiment of the field effect transistor 10b includes the first semiconductor region 14 and the second semiconductor region 16 in a spaced relationship to the first semiconductor region 14. The second variant of the body structure 18b likewise includes the first extension segment 22 that is structurally contiguous with the channel segment 20. For the sake of brevity, the commonalities relating to the various structural details of the first and second semiconductor regions 14, 16 and the body structure 18 will be omitted.

In addition to the first extension segment 22, the second variant of the body structure 18b includes a second extension segment 60 opposite the first extension segment 22 across the channel segment 20. The first lateral end 24a of the second extension segment 60 is a second extension segment left sidewall 62a, and the second lateral end 24b of the second extension segment 60 is a second extension segment right sidewall 62b.

In the second variant of the body structure 18b, the front end 30a thereof is part of the second extension segment 60 rather than the channel segment 20 as in the first variant of the body structure 18a. The front end 30a thus defines a front second extension segment wall 64 that extends from the second extension segment left sidewall 62a to the second extension segment right sidewall 62b. The second extension segment 60 also has a rear facing portion that corresponds to a left second extension segment rear wall 66a and a right second extension segment rear wall 66b. The left second extension segment rear wall 66a extends between the channel segment left sidewall 26a and the second extension segment left sidewall 62a, and the right second extension segment rear wall 66b extends between the channel segment right sidewall 26b and the second extension segment right sidewall 62b. Like the first extension segment 22, the second extension segment 60 extends laterally beyond the length of the channel segment 20 equally to the left and to the right.

As shown in FIG. 3A, the first semiconductor region 14 and the second semiconductor region 16 are disposed against the second extension segment 60, and thus the outer front walls 40b, 42b thereof may no longer define the front end 30a of the body structure 18b. Nevertheless, for the sake of consistency, the same terminology will be used in relation thereto. It is to be understood that while references are made to "front" walls, this is not intended to be limiting. The left second extension segment rear wall 66a is understood to be parallel to and abut against the outer front wall 40b of the first semiconductor region 14, and the right second extension segment rear wall 66b is understood to be parallel to and abut against the outer front wall 42b of the second semiconductor region 16.

The second extension segment left sidewall 62a is coplanar with the outer left sidewall 36a of the first semiconductor region 14 as well as the first extension segment left sidewall 28a. Along these lines, the second extension segment right sidewall 62b is coplanar with the outer right sidewall 38b of the second semiconductor region 16 and the first extension segment right sidewall 28b.

The second embodiment the field effect transistor 10b illustrated in FIG. 3A also includes the shallow trench isolation structure 48, which surrounds the first semiconductor region 14, the second semiconductor region 16, and the body structure 18. The left inner sidewall 50a of the shallow trench isolation structure 48 is parallel to and abuts against the first extension segment left sidewall 28a, the outer left sidewall 36a of the first semiconductor region, and the second extension segment left sidewall 62a. The right inner sidewall 60b of the shallow trench isolation structure 48 is parallel to and abuts against the first extension segment right sidewall 28b, the outer right sidewall 38b of the second semiconductor region 16, and the second extension segment right sidewall 62b. The front inner wall 52a is parallel to and abuts against the front second extension segment wall 64.

Figure 3B:
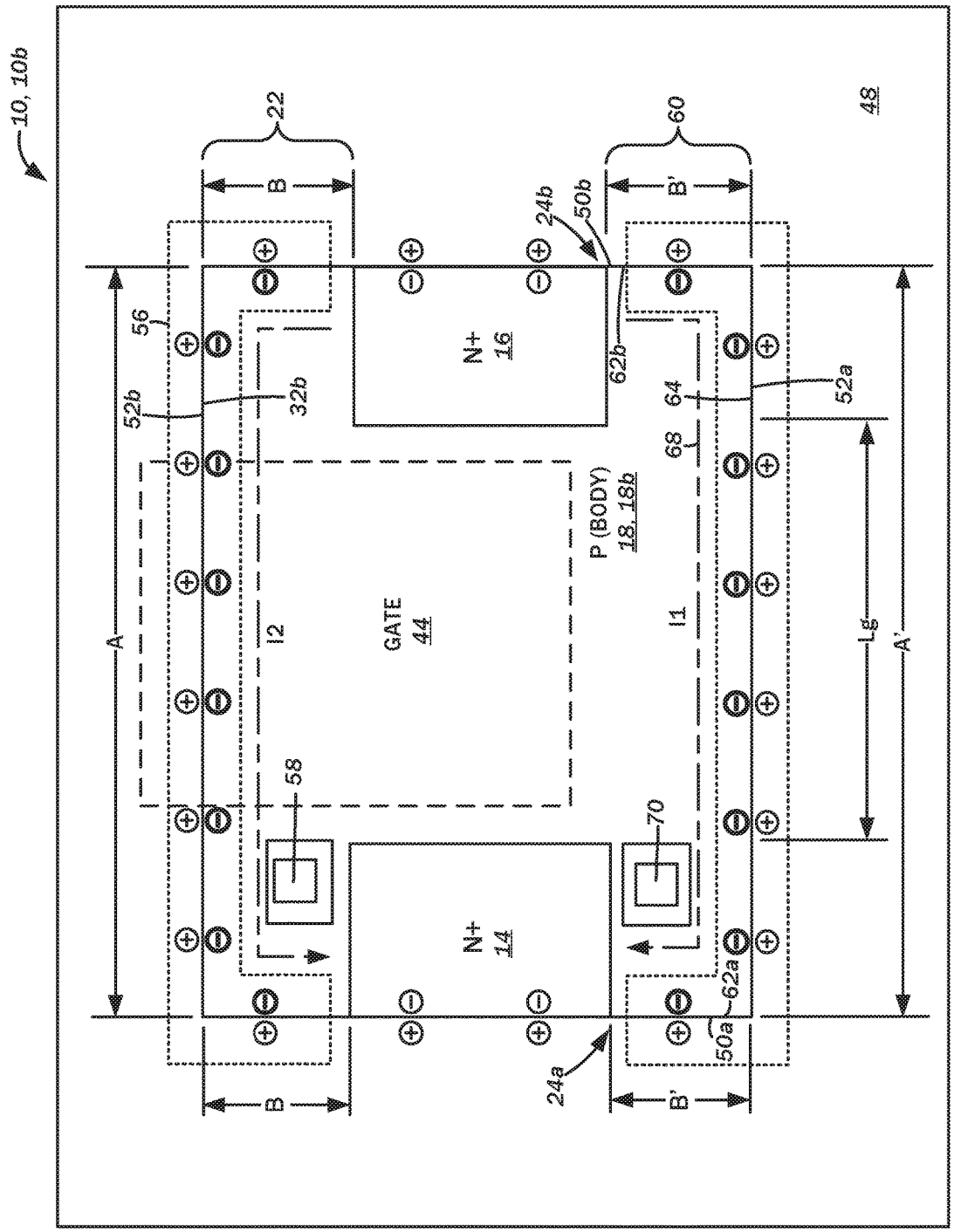
FIG. 3B is a top plan view of the second embodiment of the SOI field effect transistor depicting the positive fixed charge in the shallow trench isolation structure, the negative mobile charge in the body structure, and leakage current resulting therefrom.

Referring to FIG. 3B, again, the shallow trench isolation structure 48 has a fixed positive charge as shown, and there is additionally a mobile induced negative charge in the body structure 18 and the first and second semiconductor regions 14, 16. The p-type material of the body structure 18 and the positive charge from the shallow trench isolation structure 48 define interfaces that results in a parasitic transistor and thus current leakage. The second embodiment of the field effect transistor 10b incorporates both the first extension segment 22 and the second extension segment 60 to further reduce the leakage current by lengthening the distance between the first semiconductor region 14 and the second semiconductor region 16.

The first extension segment 22 and the second extension segment 66 moves the interface between the shallow trench isolation structure 48 and the body structure 18 away from the channel. As indicated above, the first extension interface 56 is defined between the rear inner wall 52b of the shallow trench isolation structure 48 and the rear first extension segment wall 32b. Similarly, the front inner wall 52a of the shallow trench isolation structure 48 and the front second extension segment wall 64 define a second extension interface 68. The second extension interface 68 is also defined between the left inner sidewall 50a of the shallow trench isolation structure 48 and the second extension segment left sidewall 62a, and between the right inner sidewall 50b of the shallow trench isolation structure 48 and the second extension segment right sidewall 62b.

Like the first extension interface 56, the second extension interface 68 increases the path of the leakage current I1 from the second semiconductor region 16 to the first semiconductor region 14 to the length B' of the second extension segment right sidewall 62b, plus the length A' of the front second extension segment wall 64, plus another length B' of the second extension segment left sidewall 62a. Thus, the total leakage current is the combined I1 and I2, which is understood to be less than in comparison to a shorter path as would be the case without the first extension segment 22 and the second extension segment 66. The first lateral end 24a of the second extension segment 60 further includes a body contact 70 that is connected to the body structure 18, and to either ground or a highly stable voltage source.

Figure 4A:
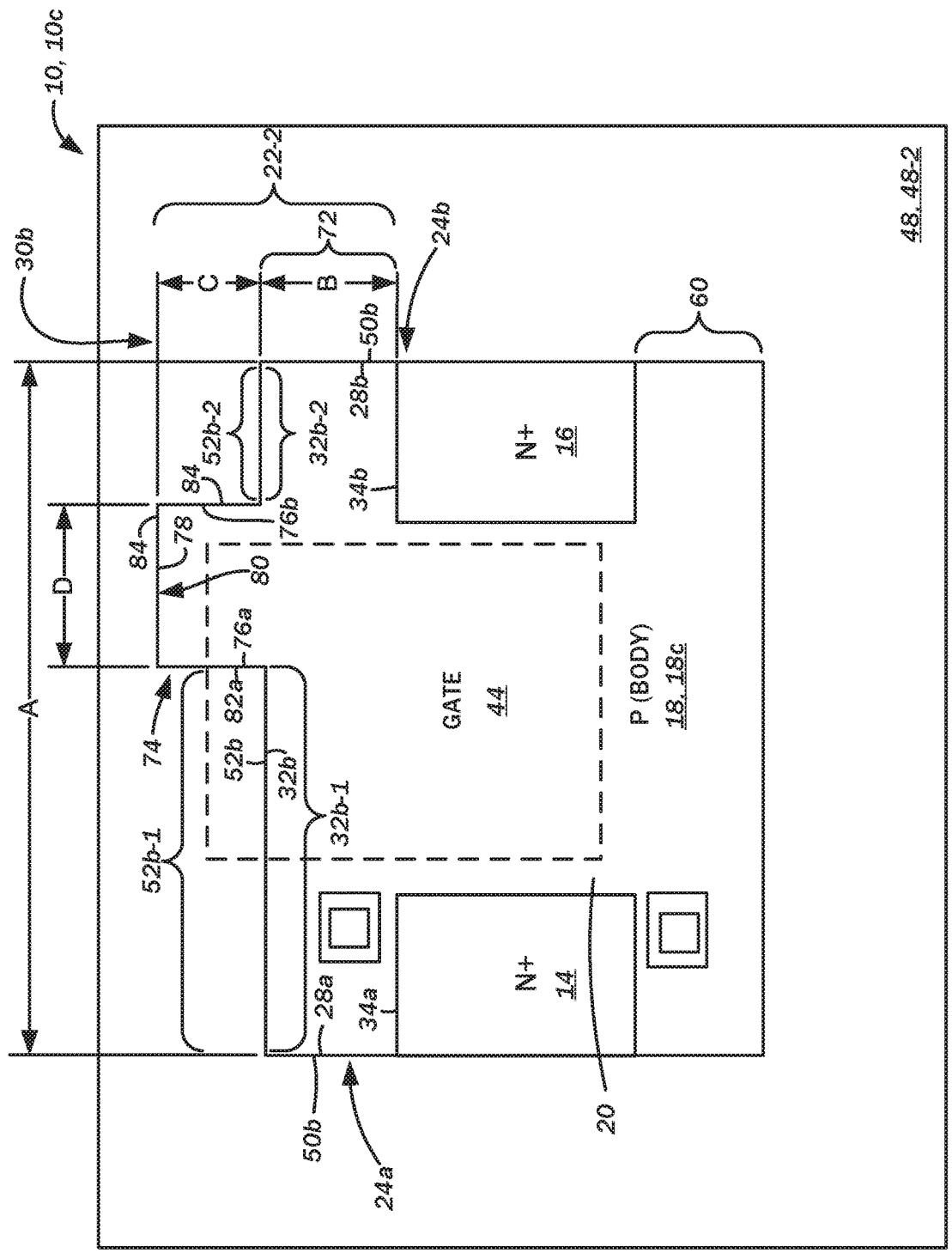
FIG. 4A is a top plan view of a third embodiment of the SOI field effect transistor.

FIG. 4A illustrates a third embodiment of the field effect transistor 10c with a third variant of the body structure 18c. Again, there is the first semiconductor region 14 and the second semiconductor region 16 in a spaced relationship to the first semiconductor region 14. The third variant of the body structure 18c includes the first extension segment 22, albeit in a modified form, denoted as a first extension segment 22-2. Like the second variant of the body structure 18b discussed above, the third variant of the body structure 18c includes the second extension segment 60 opposite the first extension segment 22-2 across the channel segment 20. For the sake of brevity, the commonalities relating to the various structural details of the first and second semiconductor regions 14, 16 and the body structure 18, including the second extension segment 60 thereof, already discussed above will be omitted.

The first extension segment 22-2 is generally defined by a main portion 72 with the same first extension segment left sidewall 28a on the first lateral end 24a, and the first extension segment right sidewall 28b on the opposite second lateral end 24b. Furthermore, the main portion 72 has the left first extension segment front wall 34a that abuts against the first semiconductor region 14, and the right first extension segment front wall 34b that abuts against the second semiconductor region 16. Extending outwardly from the rear end 30b of the body structure 18c, however, is a protruding portion 74.

At a selected location along the rear first extension segment wall 32, there is a first lateral protruding portion wall 76a that is substantially perpendicular thereto. Additionally, there is a second lateral protruding portion wall 76b that is spaced apart from the first lateral protruding portion wall 76a by a longitudinal protruding portion wall 78 having a length D. The first and second lateral protruding portion walls 76a, 76b are understood to have the same length C. With the longitudinal protruding portion wall 78, the rear first extension segment wall 32 is segregated into a first part 32b-1 and a second part 32b-2.

An alternative variant of the shallow trench isolation structure 48-2 includes a recessed portion 80 specifically configured for accommodating the protruding portion 74 of the first extension segment 22-2. In this regard, the shallow trench isolation structure 48 is in part defined by the rear inner wall 52b with a first part 52b-1 that abuts against the first part 32b-1 of the rear first extension segment wall 32b, and a second part 52b-2 that abuts against the second part 32b-2 of the rear first extension segment wall 32b. The recessed portion 80 is defined by a first lateral recessed portion wall 82a and an opposed second lateral recessed portion wall 82b spaced apart from the first lateral recessed portion wall 80a. The recessed portion 80 is also defined by a longitudinal recessed portion wall 84.

Figure 4B:
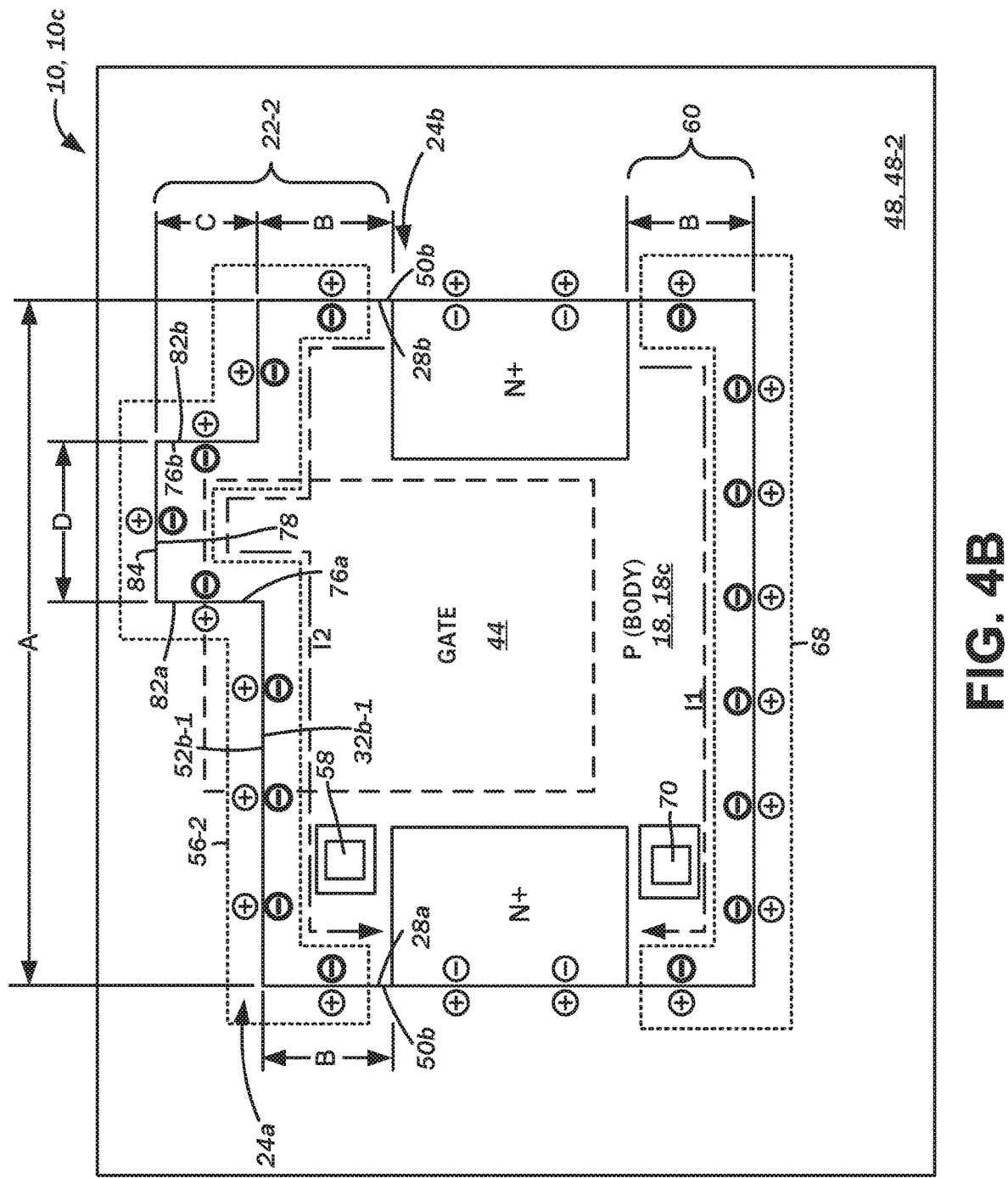
FIG. 4B is a top plan view of the third embodiment of the SOI field effect transistor depicting the positive fixed charge in the shallow trench isolation structure, the negative mobile charge in the body structure, and leakage current resulting therefrom.

FIG. 4B shows the shallow trench isolation structure 48-2 with a fixed positive charge, along with a mobile induced negative charge in the body structure 18 and the first and second semiconductor regions 14, 16. The p-type material of the body structure 18 and the positive charge from the shallow trench isolation structure 48-2 define interfaces that results in a parasitic transistor. The first extension segment 22-2 is further lengthened from the other embodiments discussed above, and continues to include the second extension segment 60, both of which together are contemplated to reduce the leakage current With the different configuration of the first extension segment 22-2, there is a different first extension interface 56-2 defined between the shallow trench isolation structure 48-2 and the body structure 18. In further detail, the first extension interface 56-2 is defined between the first extension segment left sidewall 28a and the left inner sidewall 50a, between the first part 32b-1 of the rear first extension segment wall 32 and the first part 52b-1 of the rear inner wall 52b, between the first lateral protruding portion wall 76a and the first lateral recessed portion wall 82a, between the longitudinal protruding portion wall 78 and the longitudinal recessed portion wall 84, between the second lateral protruding portion wall 76b and the second lateral recessed portion wall 82b, between the second part 32b-2 of the rear first extension segment wall 32 and the second part 52b-2 of the rear inner wall 52b, and between the first extension segment right sidewall 28b and the right inner sidewall 50b. The second extension segment 60 defines the second extension interface 68 as indicated above.

The alternatively defined first extension interface 56-2 further increases the path of the leakage current I1 from the second semiconductor region 16 to the first semiconductor region 14 to a length corresponding to a sum of the length A, plus the length D of the longitudinal protruding portion wall 78/longitudinal recessed portion wall 84, plus two times the length C to account for both the first and second lateral protruding portion walls 76a, 76b/first and second lateral recessed portion walls 82a, 82b, and plus twice the length B for the first extension segment left sidewall 28a and the first extension segment right sidewall 28b. The first lateral end 24a of both the first and second extension segments 22-2 and 60 each includes a body contact 58, 70, respectively, that are connected to the body structure 18b, and to either ground or a highly stable voltage source. The length of the first extension interface 56-2 is understood to be greater than the length of the second extension interface 68, though it will be appreciated that the two interfaces can be configured with the same length.

The leakage current is understood to be a sum of the leakage current I1 and the leakage current I2. Although a particular embodiment with the protruding portion 74 on the first extension segment 22 was presented, this is by way of example only and not of limitation. Other physical structures that thus increase the length of the first extension interface 56-2 and/or the second extension interface 68 may be substituted without departing from the scope of the present disclosure.

Figure 5:
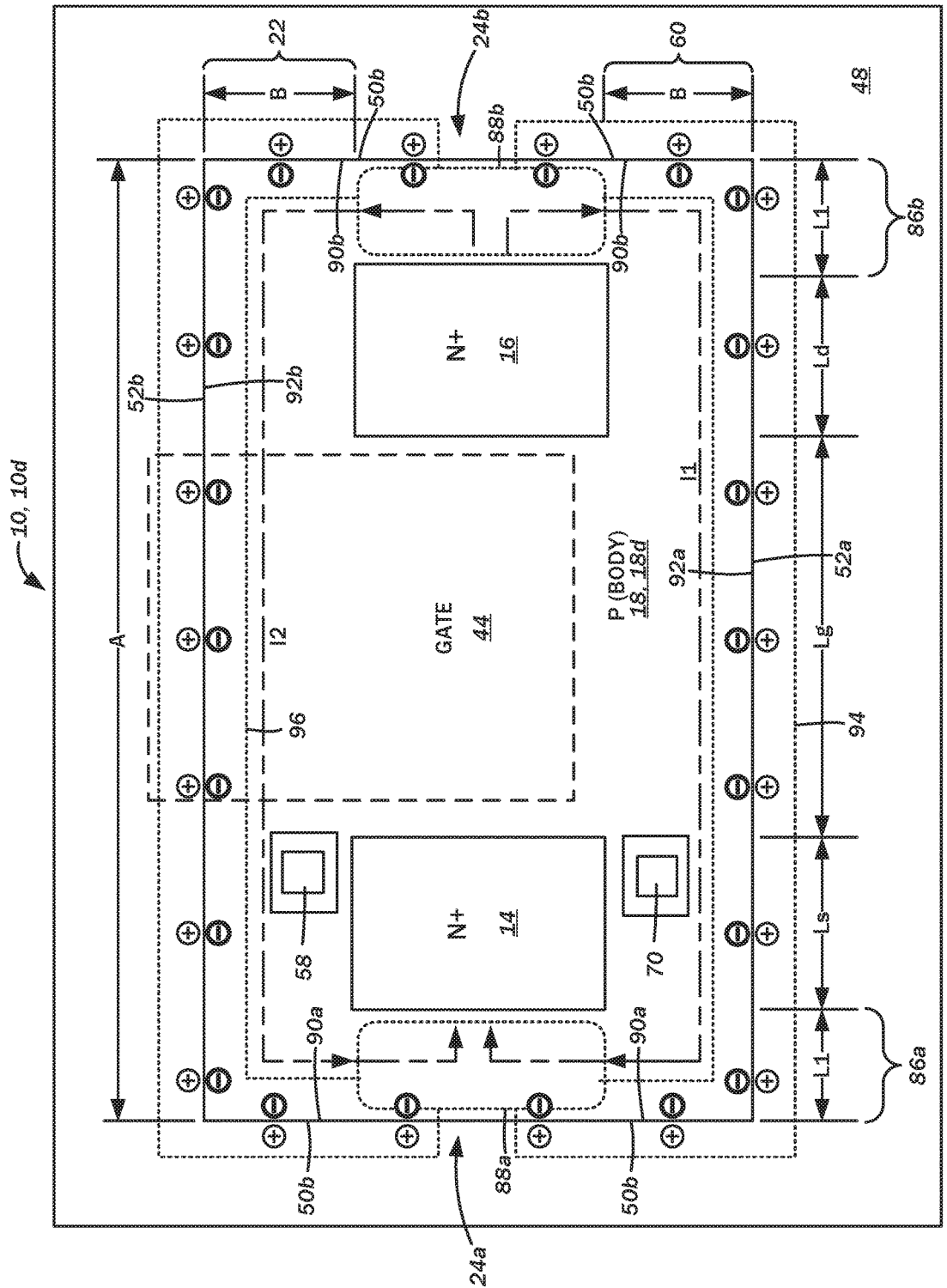
FIG. 5 is a top plan view of a fourth embodiment of the SOI field effect transistor.

FIG. 5 shows a fourth embodiment of the field effect transistor 10d with a fourth variant of the body structure 18d. Like the other embodiments, there is the first semiconductor region 14 and the second semiconductor region that is in a spaced relationship to the first semiconductor region 14. In addition to the first extension segment 22 and the second extension segment 60, this embodiment includes a first side extension 86a on the first lateral end 24a and an opposed second side extension 86b on the second lateral end 24b. The first extension segment 22, the second extension segment 60, the first side extension 86a, and the second side extension 86b, together with the channel segment 20, define a contiguous, unitary structure of the body structure 18d. Thus, the body structure 18d effectively enclose the first semiconductor region 14 and the second semiconductor region 16 within the body structure 18d, and the shallow trench isolation structure 48 surrounds the entirety of the body structure 18d. That is, the first semiconductor region 14 and the second semiconductor region 16 does not directly contact the shallow trench isolation structure 48.

Highly resistive areas 88a, 88b are thus introduced within the first side extension 86a and the second side extension 86b, respectively, that are adjacent to the first semiconductor region 14 and the second semiconductor region 16, respectively. The highly resistive areas 88 are understood to be formed because of the p-n junction between the p-type body structure 18d and the n-type first and second semiconductor regions 14, 16. As indicated above, the body structure 18d is unitary, and is accordingly defined by a left sidewall 90a, and opposed right sidewall 90b, a front wall 92a, and an opposed rear wall 92b. The shallow trench isolation structure 48 is configured similarly as that of the first embodiment 48a, and is defined by the left inner sidewall 50a, an opposed right inner sidewall 50b, a front inner wall 52a, and an opposed rear inner wall 52b. A first interface 94 is thus defined between a part of the left sidewall 90a and a part of the left inner sidewall 50a, the front wall 92a and the front inner wall 52a, and a part of the right sidewall 90b and a part of the right inner sidewall 50b. A further second interface 96 defined between a part of the left sidewall 90a and a part of the left inner sidewall 50a, the rear wall 92b and the rear inner wall 52b, and a part of the right sidewall 90b and a part of the right inner sidewall 50b.

A leakage current flows from the second semiconductor region 16 to the first semiconductor region 14 along the first interface 94 as I1, and along the second interface 96 as I2, though such currents are reduced since they pass through the highly resistive areas 88a, 88b. Again, it is contemplated that the total leakage current between the drain and the source can be minimized, and the noise figure of the field effect transistor 10d can be reduced.

Figure 6:
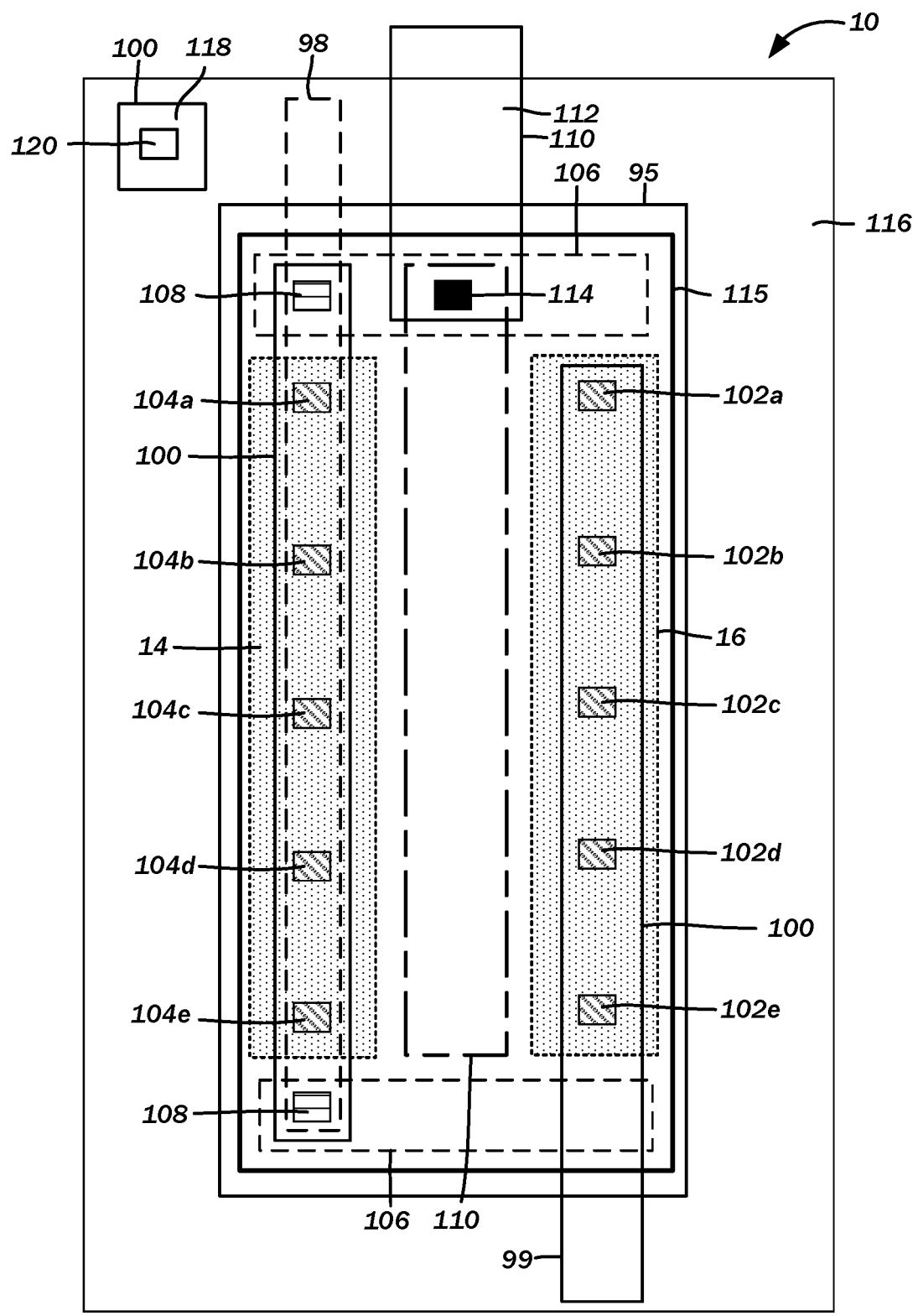
FIG. 6 is a top plan view of an n-channel metal oxide semiconductor transistor cell layout in accordance with an embodiment of the present disclosure.

FIG. 6 illustrates an exemplary layout of the field effect transistor 10 in accordance with another embodiment of the present disclosure. A transistor cell 95, which corresponds to the field effect transistor 10, includes the first semiconductor region 14 and the second semiconductor region 16, with the first semiconductor region 14 with an n+ type diffusion or implant. The first semiconductor region 14 corresponds to the source, and is accordingly connected to a source electrode 98. The second semiconductor region 16 corresponds to the drain, and is accordingly connected to a drain electrode 99 defined on a metal layer (M1) 100 via contacts 102a-102e. On the same co-planar metal layer (M1) 100, the source electrode 98 may be implemented, and there are a set of contacts 104a-104e from the metal layer 100 to the first semiconductor region 14. Alternatively, the source electrode 98 may be implemented on different metal layers not shown herein.

On opposite ends of the first and second semiconductor regions 14, 16 are a first p+ type diffusion or implant 106, with a contact 108 connecting the same to the metal layer (M1) 100. Disposed laterally between the first semiconductor region 14 and the second semiconductor region 16 is a polysilicon layer 110 corresponding to the gate, with a gate electrode 112 being implemented on the metal layer (M1) 100. There is also a contact 114 interconnecting the gate electrode 112 to the polysilicon layer 110. A p-well 115 underlies the components described above.

Various embodiments of the present disclosure additionally contemplate an n-type polysilicon guard ring 116 surrounding the transistor cell 95. A negative voltage at a predetermined level may be applied to the guard ring 116 via a guard ring electrode 118 that is also implemented on the metal layer (M1) 100. There is a contact 120 interconnecting the guard ring electrode 118 to the guard ring 116. With the negative voltage applied, it is contemplated that the guard ring 116 reduces mobile charge formation in the shallow trench isolation structure and body interface in the vicinity of the transistor channel, so leakage current and the noise figure may be reduced. Although a single transistor cell 95 is shown surrounded by the guard ring 116, this is by way of example, and any number of transistor cells 95 may be aggregated within a single, common guard ring 116.

Figure 7:
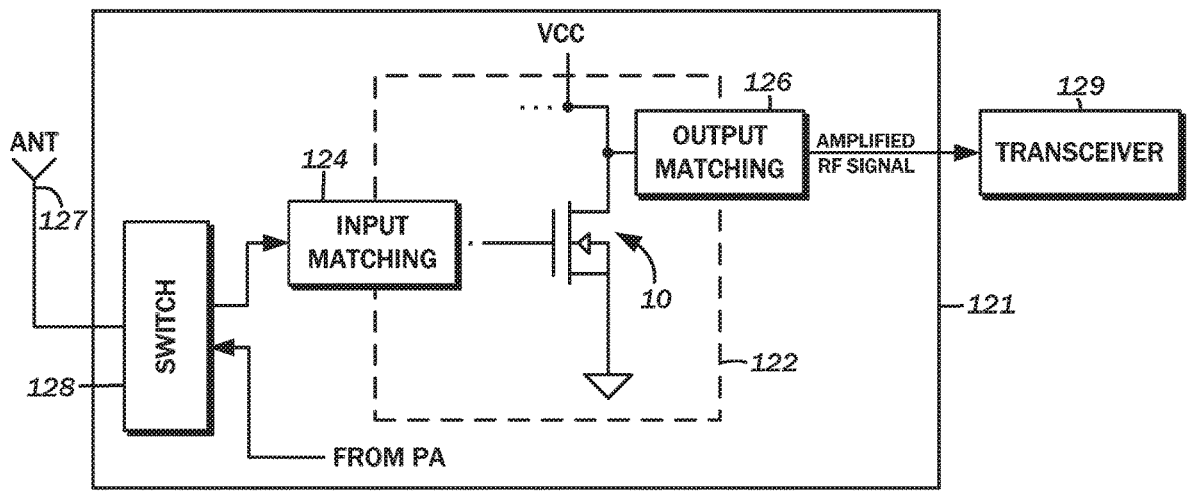
FIG. 7 is a block diagram of an exemplary front end circuit that may be implemented with various embodiments of the SOI field effect transistor.

Referring now to the block diagram of FIG. 7, the field effect transistor 10 in accordance with various embodiments of the present disclosure may be utilized in a radio frequency (RF) front end module 121. In the illustrated example, only a low noise amplifier circuit 122 is depicted, as the field effect transistor 10 is contemplated to be useful for such an application. However, it will be appreciated that the field effect transistor 10 may be utilized in any application where low leakage current and improved noise figures are desirable. The low noise amplifier circuit 122 is comprised of an amplification stage including the NMOS field effect transistor 10, with its input being connected to an input matching network 124, and its output being connected to an output matching network 126. An antenna 127 receives the broadcast RF signal, and an RF switch 128 selectively connects the same to the input of the low noise amplifier circuit 122. The RF switch 128 may also selectively connect an output from a power amplifier (not shown) to the antenna 127. Once amplified, the received RF signal is passed to a transceiver 129 for further processing. The RF front end module 121, in turn, may be used in a mobile communications device such as a cellular phone, a tablet, or any other like device.

Figure 8:
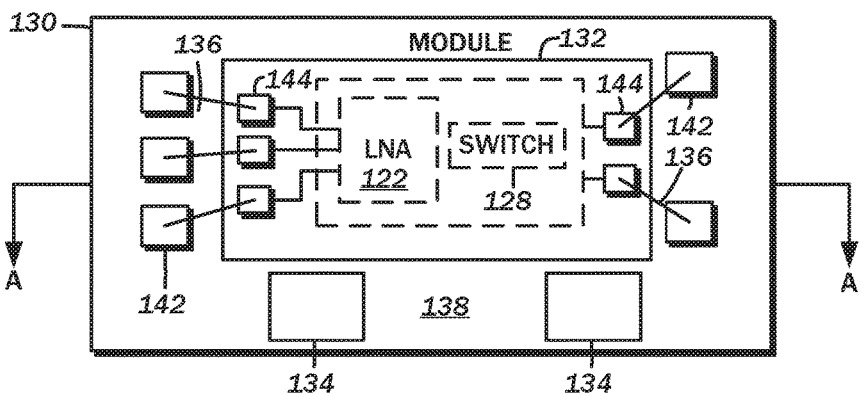
FIG. 8 is a schematic diagram of a packaged amplifier module.
Figure 9:
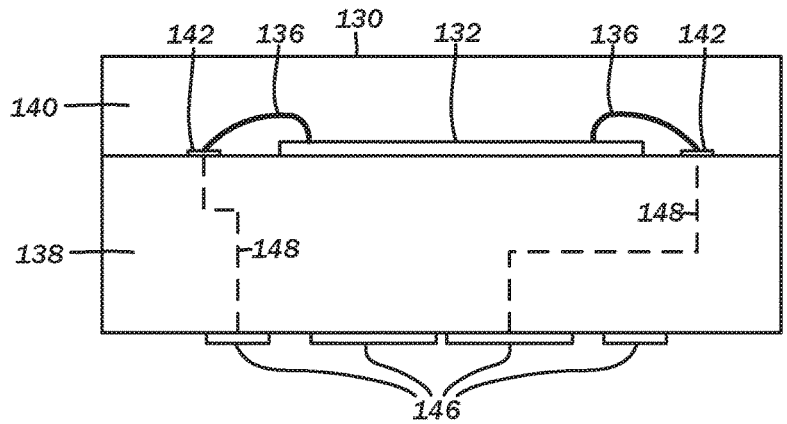
FIG. 9 is a schematic diagram of a cross-section of the packaged amplifier module shown in FIG. 8.

FIG. 8 is a schematic diagram of an embodiment of a packaged radio frequency communications module 130, while FIG. 9 is a schematic diagram of a cross-section of the packaged radio frequency communications module 130 taken along axis A-A of FIG. 8. The packaged radio frequency communications module 130 includes an integrated circuit or die 132, surface mount components 134, wire bonds 136, a package substrate 138, and an encapsulation structure 140. The package substrate 138 includes pads 142 formed from conductors disposed therein. Additionally, the die 132 includes pads 144, and the wire bonds 136 are used to electrically connect the pads 144 of the die 132 to the pads 142 of the package substrate 138.

The die 132 includes the low noise amplifier circuit 122 and the RF switch 128 implemented with the field effect transistor 10 of the present disclosure. These components on the die 202 are understood to be as described above. The die 132 is mounted to the package substrate 138 as shown, though it may be configured to receive a plurality of additional components such as the surface mount components 134. These components include additional integrated circuits as well as passive components such as capacitors, inductors, and resistors.

As shown in FIG. 9, the packaged radio frequency communications module 130 is shown to include a plurality of contact pads 146 disposed on the side of the packaged radio frequency communications module 130 opposite the side used to mount the die 132. Configuring the packaged radio frequency communications module 130 in this manner can aid in connecting the same to a circuit board of a wireless communications device. The example contact pads 146 can be configured to provide radio frequency signals, bias signals, power low voltage(s) and or power high voltage(s) to the die 132 and/or the surface mount components 134. The electrical connections between the contact pads 146 and the die 132 can be facilitated by connections 148 through the package substrate 138. The connections 148 can represent electrical paths formed through the package substrate 138, such as connections associated with vias and conductors of a multilayer laminated package substrate.

In some embodiments, the packaged radio frequency communications module 130 can also include or more packaging structures to, for example, provide protection and/or to facilitate handling of the packaged radio frequency communications module 130. Such a packaging structure can include overmold or encapsulation structure 140 formed over the package substrate 138 and the components and die(s) disposed thereon.

It will be understood that although the packaged radio frequency communications module 130 is described in the context of electrical connections based on wire bonds, one or more features of the present disclosure can also be implemented in other packaging configurations, including, for example, flip-chip configurations.

The particulars shown herein are by way of example and for purposes of illustrative discussion of the embodiments of the field effect transistors, and are presented in the cause of providing what is believed to be the most useful and readily understood description of the principles and conceptual aspects. No attempt is made to show details with more particularity than is necessary, the description taken with the drawings making apparent to those skilled in the art how the several forms of the present disclosure may be embodied in practice.

What is claimed is:

1. A field effect transistor, comprising:
a first semiconductor region having a uniform structure;
a second semiconductor region having a uniform structure and in a spaced relationship to the first semiconductor region;
a body structure defined by a channel segment between the first semiconductor region and the second semiconductor region with channel segment side walls facing respective inner side walls of the first and second semiconductor regions, and a first extension segment structurally contiguous with the channel segment and defining extension segment front walls facing and extending between vertical extents of respective rear walls of the first and second semiconductor regions, the channel segment side walls facing and extending between vertical extents of the respective inner side walls of the first and second semiconductor regions as singular surfaces, the channel segment and the first extension segment having substantially same thicknesses; and
a shallow trench isolation structure surrounding the first semiconductor region, the second semiconductor region, and the body structure, a first extension interface being defined between the shallow trench isolation structure and the first extension segment of the body structure to reduce leakage current flowing from the second semiconductor region to the first semiconductor region through a parasitic interface with the body structure, the shallow trench isolation structure and the channel segment of the body structure defining a channel interface, the first extension interface being longer than the channel interface.

2. The field effect transistor of claim 1 further comprising a transistor gate disposed on a gate oxide layer disposed on a top surface of the body structure and between the first semiconductor region and the second semiconductor region.

3. The field effect transistor of claim 1 wherein the body structure is defined by a first lateral end and a second lateral end, the first semiconductor region being disposed toward the first lateral end and the second semiconductor region being disposed toward the second lateral end.

4. The field effect transistor of claim 3 wherein the first semiconductor region and the second semiconductor region abut against respective interior sidewalls of the shallow trench isolation structure.

5. The field effect transistor of claim 1 wherein the first semiconductor region corresponds to a transistor source terminal.

6. The field effect transistor of claim 1 wherein the second semiconductor region corresponds to a transistor drain terminal.

7. The field effect transistor of claim 1 wherein the first semiconductor region and the second semiconductor region are doped with an n-type dopant.

8. The field effect transistor of claim 1 wherein the body structure is doped with a p-type dopant.

9. The field effect transistor of claim 1 wherein the shallow trench isolation structure is a silicon dioxide ($SiO_2$) dielectric material.

10. The field effect transistor of claim 1 further comprising a buried oxide layer disposed underneath the first and second semiconductor regions, the body structure, and the shallow trench isolation structure.

11. The field effect transistor of claim 1 further comprising a polysilicon guard ring surrounding the first and second semiconductor regions, and at least a portion of the body structure, a negative voltage being applied to the polysilicon guard ring to reduce mobile charge formation at the first extension interface.

12. A semiconductor die comprising:
a semiconductor substrate;
a shallow trench isolation structure disposed on the semiconductor substrate; and
a plurality of transistor elements disposed on the semiconductor substrate, each of the transistor elements being surrounded at least partially by the shallow trench isolation structure and including a first semiconductor region having a uniform structure, a second semiconductor region having a uniform structure and in a spaced relationship to the first semiconductor region, and a body structure contiguous with the semiconductor substrate with channel segment side walls facing respective inner side walls of the first and second semiconductor regions, and defined by a channel segment between the first semiconductor region and the second semiconductor region, one of the plurality of transistor elements including a first extension segment structurally contiguous with the channel segment and defining extension segment front walls facing and extending between vertical extents of respective rear walls of the first and second semiconductor regions, the channel segment side walls facing and extending between vertical extents of the respective inner side walls of the first and second semiconductor regions as singular surfaces, the channel segment and the at least one extension segment having substantially same thicknesses, at least one extension interface being defined between the shallow trench isolation structure and the first extension segment of the body structure of the one transistor element to reduce leakage current flowing from the second semiconductor region to the first semiconductor region through a parasitic interface with the body structure, the shallow trench isolation structure and the channel segment of the body structure of the one transistor element defining a channel interface, the at least one extension interface being longer than the channel interface.

13. A radio frequency communications device comprising:
   a transceiver configured to process radio frequency signals;
   an antenna configured to facilitate transmission and reception of the radio frequency signals; and
   a low noise amplifier having an input connected to the antenna and an output connected to the transceiver, the low noise amplifier being implemented with at least one field effect transistor including a first semiconductor region having a uniform structure, a second semiconductor region having a uniform structure and in a spaced relationship to the first semiconductor region, a body structure defined by a channel segment between the first semiconductor region and the second semiconductor region, with channel segment side walls facing respective inner side walls of the first and second semiconductor regions, and a first extension segment structurally contiguous with the channel segment and defining extension segment front walls facing and extending between vertical extents of respective rear walls of the first and second semiconductor regions, the channel segment side walls facing and extending between vertical extents of the respective inner side walls of the first and second semiconductor regions as singular surfaces, the channel segment and the first extension segment having substantially same thicknesses, and a shallow trench isolation structure surrounding the first semiconductor region, the second semiconductor region, and the body structure, a first extension interface being defined between the shallow trench isolation structure and the first extension segment of the body structure to reduce leakage current flowing from the second semiconductor region to the first semiconductor region through a parasitic interface with the body structure, the shallow trench isolation structure and the channel segment of the body structure of the field effect transistor defining a channel interface, the first extension interface being longer than the channel interface.

* * * * *